Feb. 19, 1957 R. E. COLANDER ET AL 2,782,311

BRIDGE CONTROLLED OSCILLATOR

Filed Sept. 17, 1953

R. E. Colander
W. H. Chester
INVENTORS

BY [signature]
ATTORNEY

United States Patent Office 2,782,311

Patented Feb. 19, 1957

2,782,311

BRIDGE CONTROLLED OSCILLATOR

Roy E. Colander, Reseda, and William H. Chester, North Hollywood, Calif., assignors to Bendix Aviation Corporation, North Hollywood, Calif., a corporation of Delaware Application September 17, 1953, Serial No. 380,746

5 Claims. (Cl. 250—36)

This invention relates to variable frequency electronic oscillators and is particularly useful where the frequency is to be varied in accordance with a variation in impedance of a sensing element to produce frequency modulatons corresponding to the impedance change, the variable-impedance sensing element being usually incorporated in a bridge circuit or the equivalent.

An object of the invention is to improve the stability, sensitivity and linearity of, and to reduce the generation of unwanted amplitude modulation in, an oscillator of the type outlined.

A further object is to provide an oscillator such that resistive or reactive impedances or a differential transformer may be employed to control the oscillator frequency.

A feature of the invention is a bridge or transformer controlled oscillator in which the frequency modulating bridge or transformer is separate from the auxiliary to the primary positive feedback loop of the oscillator.

A full understanding of the invention may be had from the description to follow with reference to the drawing, in which.

Several circuits employing bridge impedance variation to control the frequency of an oscillator have been proposed in the past. Such circuits have employed the bridge in one manner or another as an element in the positive feedback circuit of a phase shift or Wein bridge oscillator and generally exhibit a poor degree of stability and linearity, because the bridge must generally be associated with high impedance circuit elements. An additional problem with such circuits is the generation of unwanted amplitude modulation. The present invention improves the stability and linearity and decreases the unwanted amplitude modulation, and it is believed that the improvement results chiefly from the segregation of the frequency varying circuit from the positive feedback loop of the oscillator.

Figure 1:
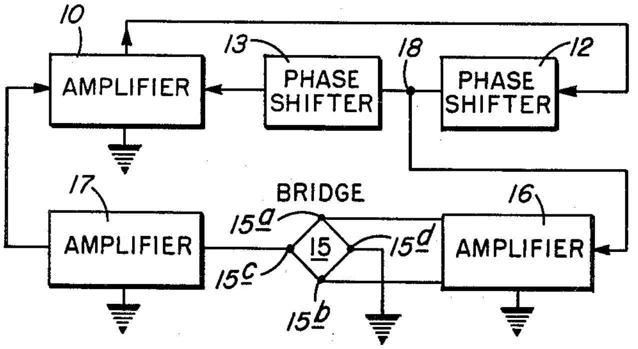
Fig. 1 is a block diagram circuit showing the usual elements of an oscillator in accordance with the invention.

Referring to the block diagram of Fig. 1, the invention comprises an oscillator consisting of an amplifier 10 having its output and its input connected by a feedback circuit in such relation as to produce positive feedback and sustain oscillations in the circuit. The feedback circuit consists of two series phase shifting elements 12 and 13, respectively, which together produce zero phase shift and constitute, with the amplifier 10, a closed loop circuit.

The frequency control circuit comprises a bridge 15 having input terminals 15*a* and 15*b* connected to the output of an amplifier 16, the input of which is connected to the closed loop circuit of the oscillator at a point 18 intermediate the two phase shifting elements 12 and 13. The output terminals 15*c* and 15*d* of bridge 15 are connected to the input circuit of an amplifier 17, the output of which is connected to an input of the amplifier 10. It will be apparent that so long as the bridge 15 is balanced, its output is zero, and no potential is delivered by the frequency controlling circuit to the amplifier 10, but if the bridge is unbalanced, as by variation of the impedance in one of its arms or branches, a potential of the same frequency as that of the oscillator will be delivered from the point 18 intermediate the phase shifting elements 12 and 13 to the input of amplifier 10.

The two phase shifting elements 12 and 13 are so chosen that the potential at point 18 is 90° displaced from the potential applied to the amplifier 10 from the phase shifter 13. Therefore, whenever the bridge 15 is unbalanced, a quadrature voltage is delivered from the amplifier 17 to the amplifier 10, its sign being dependent upon the direction of change of impedance in the bridge arm.

Since the potential applied from amplifier 17 to amplifier 10 is relatively small and is in quadrature to the potential delivered to amplifier 10 from the phase shifting element 13, it effects the least possible increase or decrease of the amplitude of the oscillations, but tends to change the phase angle of the potential at the output of the amplifier 10 relative to that at point 18. As is well known, under such a condition the frequency of oscillations changes to a new value such that zero phase shift around said loop is maintained.

In practice, the amplifier 10 usually includes an input amplifier stage and an output cathode follower stage to present a low output impedance. By using a low impedance at this point in the oscillator loop circuit and providing the amplifier 16 between the point 18 and the bridge 15, the latter is sufficiently isolated from the point 18 as to produce substantially no reaction thereat. The amplifier 16 also is usually so designed as to provide positive gain to increase the potential applied to the bridge 15 and thereby increase the sensitivity of response to signals. The amplifier 17 may sometimes be omitted. Under other conditions, it may comprise a cathode follower to present a low impedance to the input circuit of the amplifier 10.

Figure 2:
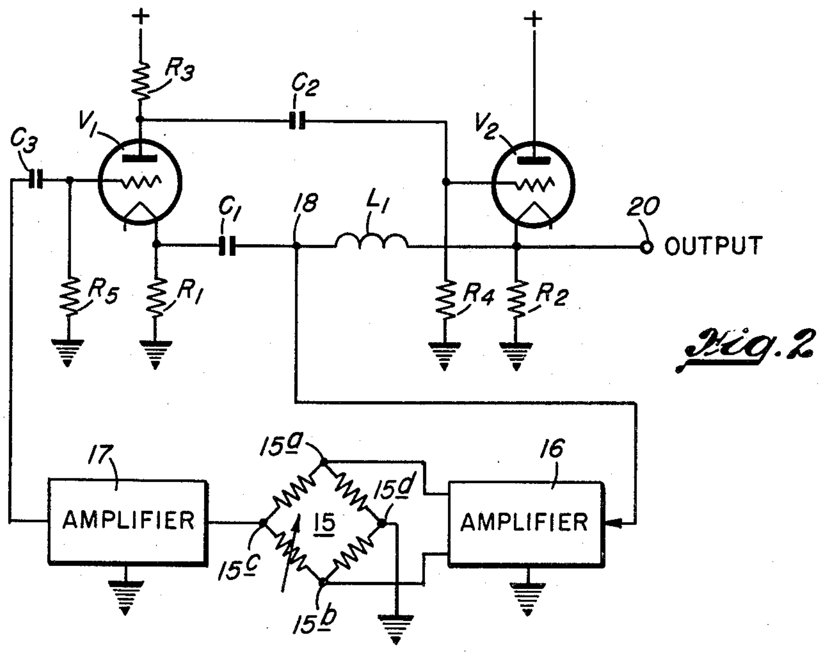
Fig. 2 is a schematic diagram showing some circuit details that may be employed in the general circuit of Fig. 1.

A typical oscillator circuit that may be employed in the circuit of Fig. 1 is illustrated in Fig. 2. Here the amplifier 10 consists of a grounded grid triode $V_1$ and a cathode follower tube $V_2$. The tube $V_1$ has its grid connected to ground through a resistor $R_5$ and connected to the output of the amplifier 17 through a capacitor $C_3$, its cathode connected to ground through a resistor $R_1$, and its anode connected to a source of anode potential through a resistor $R_3$. The tube $V_2$ is a triode connected as a cathode follower with its grid connected to ground through a grid leak resistor $R_4$ and its cathode connected to ground through a coupling resistor $R_2$, and its anode connected directly to the source of anode potential. The cathode is also connected to the output terminal 20 of the oscillator.

The phase shifting elements 12 and 13 consist of an inductance $L_1$ and a capacitor $C_1$ connected in series between the cathode of tube $V_2$ and the cathode of $V_1$, the values being so chosen that the series circuit is resonant at the mid-frequency of the oscillator.

If no signal is impressed on the grid of tube $V_1$ from the amplifier 17, and assuming essentially zero phase shift due to the load and coupling elements $R_1$, $R_2$, $R_3$, $R_4$, $R_5$, $C_2$ and $C_3$, oscillations will occur at the frequency at which the phase shifting elements $C_1$ and $L_1$ are series resonant. Under such conditions of normal oscillation, the potential at point 18, the junction of the phase shifting elements $C_1$ and $L_1$, will lead the potentials at the cathodes of tubes $V_1$ and $V_2$ by 90°. The potential appearing at point 18 is fed to the amplifier 16 and thence to the input terminals 15*a* and 15*b* of the bridge 15.

When the bridge is in balance, no output potential is fed to the amplifier 17, and thus no quadrature potential appears across resistor $R_5$; the basic oscillator output frequency being determined by the series resonant frequency of the elements $L_1$ and $C_1$, even though the auxiliary feedback loop containing the bridge has been added.

If the bridge is unbalanced, a potential will appear across $R_5$ and will be essentially either in phase or 180° out of phase with the potential at the point 18, depending upon the direction of bridge unbalance. It has been found that the amplitude of this potential for small amounts of bridge unbalance is almost exactly proportional to the magnitude of the unbalance.

It was previously observed that the potential impressed at the cathode of tube $V_1$ through the capacitor $C_1$ lagged the potential at point 18 by 90°. Thus the potential applied to the grid of tube $V_1$ will either lead or lag the potential impressed on the cathode of that tube by 90°. Both the potential appearing at the grid and the potential appearing at the cathode of tube $V_1$ are amplified, and the vector addition of these potentials determines the phase shift at the anode of tube $V_1$. Since the total phase shift produced by the positive feedback circuit ($C_2$, $L_1$ and $C_1$) must be zero to maintain stable oscillations, the output frequency will shift to that frequency at which the total phase shift, including the shift in the anode circuit of tube $V_1$ due to the vectorial addition of amplified grid and cathode potentials, is zero. Over a relatively wide range of frequencies, the oscillator output frequency will deviate from its normal center frequency by an amount which is proportional to the magnitude of the bridge unbalance. The frequency will deviate lower if the potential impressed on the grid of tube $V_1$ is lagging and will deviate higher if this potential is leading. Thus direction, as well as magnitude of bridge unbalance, is indicated by the nature of the frequency response.

As shown in Figs. 1 and 2, the bridge 15 is a simple resistance bridge. However, the system is not limited to use with such a bridge, and its arms may contain either positive or negative reactance, with or without resistance. When the oscillator is to be frequency modulated in response to variation in resistance, say of a strain gauge or the like, a pure resistance bridge is indicated. On the other hand, some sensing devices employ a reactance element which may be either an inductance or a condenser, the reactance of which is altered in response to the value sensed.

Figure 3:
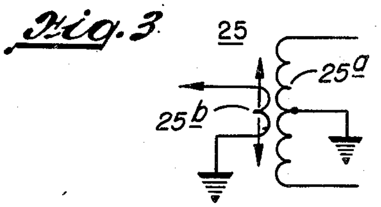
Fig. 3 is a schematic diagram of a differential transformer that may be substituted for the bridge in the circuit of Fig. 1 or Fig. 2.

It is also sometimes desirable to control the frequency of an oscillator in response to movement. Under such conditions there may be substituted for the ordinary bridge 15 a differential transformer 25 as indicated in Fig. 3, having a primary winding 25*a* energized from the amplifier 16 and a movable secondary winding 25*b* connected to the input of the amplifier 17. The adjustable secondary winding 25*a* can be adjusted into a null position with respect to the primary winding 25*b*, in which it generates no potential. In response to departures in either direction from the null position it develops potentials, the phase and magnitude of which are a function of the direction and amplitude of displacement from the null position. As used in the claims, "bridge means" is defined as any device having input and output terminals and adjustable from a null condition in which a potential applied to the input terminals does not appear at the output terminals, into conditions in which it does.

The circuits described have been found to have substantially better temperature stability than the prior art oscillators in which the bridge or differential transformer, or the like, was incorporated in the positive feedback circuit. It is also more immune to variations in cathode and anode voltage. Sensitivity is such that where the full band width is 15% of the center frequency, output frequency deviation over full band width can be obtained with a change of ±0.5% in the resistance of one arm of the bridge. As is well known, sensitivity increases proportionally with the use of two or more active arms in the bridge.

Although for the purpose of explaining the invention, a particular embodiment thereof has been shown and described, obvious modifications will occur to a person skilled in the art, and we do not desire to be limited to the exact details shown and described.

We claim:

1. Apparatus of the type described comprising: an oscillator consisting of an amplifier and positive feedback circuit means connecting the output of the amplifier to the input thereof at a predetermined frequency and defining with the amplifier a closed loop circuit; means for deriving from said loop circuit a potential in quadrature to the potential applied to the amplifier input by said positive feedback circuit; and amplitude modulating bridge means separate from said loop circuit having an input circuit connected to said quadrature potential deriving means and an output circuit connected to the amplifier input, for variably applying said quadrature potential to said amplifier input without further phase shift.

2. Apparatus according to claim 1 in which said quadrature potential deriving means comprises a capacity and inductance in series in said loop circuit resonating at said predetermined frequency, and means coupling the junction of said capacity and inductance to said bridge input circuit.

3. Apparatus according to claim 2 in which said amplifier comprises an input amplifier tube and a cathode follower, said input tube having a control grid connected to ground through a coupling impedance, a cathode connected to ground through a coupling impedance, and an anode connected to ground through a coupling impedance and a source of anode potential, and means coupling the anode of said input tube to the grid of the cathode follower; said series capacity and inductance being connected between the cathodes of said cathode follower and said input tube, respectively; and means including said bridge means connecting said junction to the grid of said input tube.

4. Apparatus according to claim 3 in which said means connecting said junction to the grid of said input tube includes amplifying means connecting said junction to the input of said bridge means.

5. Apparatus according to claim 3 in which said means connecting said junction to the grid of said input tube includes amplifying means interposed between the output of said bridge means and the grid of said input tube.

References Cited in the file of this patent

UNITED STATES PATENTS

| | | |
|---|---|---|
| 2,451,858 | Mork | Oct. 19, 1948 |
| 2,611,873 | Gager et al. | Sept. 23, 1952 |
| 2,615,956 | Broding | Oct. 28, 1952 |
| 2,659,867 | Mathwich | Nov. 17, 1953 |